（12） United States Patent
Yoon

(10) Patent No.: US 9,029,957 B2
(45) Date of Patent: May 12, 2015

(54) SEMICONDUCTOR DEVICE AND METHOD FOR FABRICATING THE SAME

(71) Applicant: SK Hynix Inc., Icheon (KR)

(72) Inventor: Ahn Sook Yoon, Icheon-si (KR)

(73) Assignee: SK Hynix Inc., Icheon (KR)

( * ) Notice: Subject to any disclaimer, the term of this patent is extended or adjusted under 35 U.S.C. 154(b) by 223 days.

(21) Appl. No.: 13/714,851

(22) Filed: Dec. 14, 2012

(65) Prior Publication Data

US 2014/0042554 A1    Feb. 13, 2014

(30) Foreign Application Priority Data

Aug. 7, 2012 (KR) .................. 10-2012-0086458

(51) Int. Cl.
*H01L 27/108* (2006.01)
*H01L 21/8234* (2006.01)
*H01L 29/423* (2006.01)

(52) U.S. Cl.
CPC .... *H01L 21/823475* (2013.01); *H01L 29/4236* (2013.01); *H01L 21/823456* (2013.01); *H01L 27/10855* (2013.01); *H01L 27/10876* (2013.01); *H01L 27/10885* (2013.01); *H01L 27/10894* (2013.01)

(58) Field of Classification Search
CPC ................. H01L 21/823475; H01L 27/10876; H01L 27/10894; H01L 29/4236
See application file for complete search history.

(56) References Cited

U.S. PATENT DOCUMENTS

| 2009/0001456 A1* | 1/2009 | Kim .............................. 257/330 |
| 2011/0193143 A1* | 8/2011 | Loechelt et al. .............. 257/288 |
| 2011/0260242 A1* | 10/2011 | Jang .............................. 257/331 |

* cited by examiner

*Primary Examiner* — Shaun Campbell
*Assistant Examiner* — Raj R Gupta

(57) ABSTRACT

A semiconductor device is formed by depositing a nitride material having a lower etch rate than an oxide material over or between buried gates when forming a metal contact at an end portion of a cell region, to prevent a lower substrate from being etched during an etching process forming a metal contact hole. The semiconductor device includes at least one buried gate formed in a device isolation film of a semiconductor substrate, an etch stop film formed over and between the buried gates, and a metal contact formed perpendicular to the buried gate in the etch stop film.

18 Claims, 8 Drawing Sheets

SEMICONDUCTOR DEVICE AND METHOD FOR FABRICATING THE SAME

CROSS-REFERENCE TO RELATED APPLICATION

The present application claims priority to Korean patent application No. 10-2012-0086458 filed on 7 Aug. 2012, which is incorporated by reference in its entirety.

BACKGROUND OF THE INVENTION

Embodiments of the present invention relate to a semiconductor device and a method for fabricating the same, and more particularly to a technology for depositing a nitride material having a lower etch rate than an oxide material over or between buried gates when forming a metal contact at an end portion of a cell region.

Although the demand of implementing high-capacity dynamic random access memory (DRAM) is rapidly increasing, there is difficulty in increasing chip size, resulting in a limitation in increasing storage capacity of DRAM. The larger the chip size, the less the number of chips on each wafer, resulting in a reduction of productivity. Therefore intensive research is being conducted into a variety of methods for reducing a cell region by varying a cell layout so as to form a large number of memory cells on one wafer.

A buried gate structure has been developed as an example of the above-mentioned methods. The buried gate is located below a semiconductor silicon substrate and a metal contact for voltage supply (or power supply) to the buried gate is required.

Usually, a metal contact transmits input/output (I/O) operation signals to the buried gate is formed in a larger size than that of underlying buried gate.

Thus, if misalignment occurs in a masking process for metal contact formation, a device isolation film between the buried gates (BGs) in a cell region is attacked. Furthermore, a semiconductor substrate (Sub) below the device isolation film also might be attacked. It causes current leakage or an electrical short, resulting in reduction of reliability of the semiconductor device.

In order to solve the above-mentioned problems, an over-etch process in the cell region should be refrained from so that the metal contact in the cell region is formed more shallow. For example, a bottom of the metal contact can be formed at a higher level than any surface of the substrates 101a, 101b, 101c. However, a depth of the metal contact in the cell region cannot be arbitrarily adjustable because another metal contact is formed, in a simultaneous process, in a peripheral region so as to extend down to a substrate in the peripheral region.

BRIEF SUMMARY OF THE INVENTION

Various embodiments of the present invention are directed to providing a semiconductor device and a method for fabricating the same that substantially obviate one or more problems due to limitations and disadvantages of the related art, including those disclosed herein.

An embodiment of the present invention relates to a semiconductor device in which a nitride material having a low etch rate is deposited over or between buried gates when forming a metal contact at an end portion of a cell region to prevent a lower substrate from being etched when forming a metal contact hole over the buried gates, and a method for forming the semiconductor device.

In accordance with an aspect of the present invention, a semiconductor device includes at least one buried gate formed in a device isolation film of a semiconductor substrate; an etch stop film formed over and between the buried gates; and a metal contact formed in the etch stop film, perpendicular to the buried gate.

The etch stop film is formed of a material having a lower etch rate than the device isolation film. The etch stop film is formed of a nitride film.

The buried gate, the etch stop film, and the metal contact are formed in an end portion of a cell region.

In accordance with another aspect of the present invention, a method for fabricating a semiconductor device includes forming an insulation film in a cell region including a buried gate and a bit line structure and in a peripheral region including a peri-gate structure; forming an open region to expose a sidewall of the buried gate located in an end portion of the cell region, by etching some portions of the insulation film located in the end portion of the cell region; depositing an etch stop material over the cell region including the open region and over the peripheral region; forming an etch stop film by etching the etch stop material in the cell region using a cell-open mask; forming a first metal contact hole, perpendicular to the buried gate, in the etch stop film; and forming a metal contact by filling a conductive material in the first metal contact hole.

The step of forming the open region includes: simultaneously forming a first trench extending to a device isolation film in a center part of the cell region.

The step of depositing the etch stop material includes: depositing the etch stop material over the first trench.

The step of depositing the etch stop material includes: depositing the etch stop material over and between the buried gates.

The step of forming the etch stop film includes: forming a second trench for storage node formation by etching the etch stop material in a center part of the cell region; and depositing a conductive material in the second trench.

The step of forming the first metal contact hole perpendicular to each buried gate includes: simultaneously forming a second metal contact hole at both sides of the peri-gate structure in the peripheral region.

The etch stop film material has a lower etch rate than the device isolation film. The etch stop film material is a nitride material.

In accordance with another aspect of the present invention, a semiconductor device includes first power supply contacts provided in a cell end region; cell gates formed below the first power supply contacts and formed in a first device isolation film of the cell end region, respectively; and an etch stop film extending from between the first power supply contacts to between the cell gates.

The device further include a second power supply contact coupled to an active region in a peripheral region, wherein the etch stop film extends down to a first level, and wherein the second power supply contact extends down to a second level higher than the first level.

The first power supply contacts are coupled to the cell gates, respectively, and wherein the second power supply contact is coupled to the active region.

The etch stop film extends down to a first level, and wherein the cell gates extends down to a third level lower than the first level.

The first device isolation film extends down to a fourth level lower than the third level.

The etch stop film extends down to a first level, and wherein first power supply contacts extend down to a fifth level higher than the first level.

The fifth level is substantially the same as a top surface of any of the cell gates.

The etch stop film extends down to a first level, and wherein an upper surface of a substrate in the cell end region extends up to a sixth level higher than the first level.

The etch stop film has a first etch selectivity with respect to a given etching condition, wherein the first device isolation film has a second etch selectivity with to the given etching condition, and wherein the first etch selectivity is lower than the second etch selectivity.

The etch stop film includes an nitride-containing layer, and wherein the first device isolation film includes a oxide-containing layer.

The device further include an insulating layer provided in the peripheral region, defining the second power supply contact, and having a third etch selectivity, wherein the etch stop film has a first etch selectivity with respect to a given etching condition, and wherein the first etch selectivity is lower than the third etch selectivity with respect to the given etching condition.

The first device isolation film has a second etch selectivity with to the given etching condition, and wherein the third etch selectivity is substantially the same as the second etch selectivity.

The device further include a cell center region laterally extending from the cell end region, a storage node contact provided in the cell center region and extending down to an eighth level higher than the first level.

The cell gates extend to the cell center region, and wherein the storage node contact is coupled to any of the cell gates.

It is to be understood that both the foregoing general description and the following detailed description of the present invention are only exemplary and are intended to provide further explanation of the invention as claimed, but are not limited to the described embodiments.

DESCRIPTION OF EMBODIMENTS

Reference will now be made in detail to embodiments of the present invention, examples of which are illustrated in the accompanying drawings. Wherever possible, the same reference numbers are used throughout the drawings to refer to the same or like portions. In the following description of the present invention, a detailed description of related known configurations or functions incorporated herein may be omitted for clarity of the subject matter of the present invention.

In accordance with the following description of the present invention, a material having a low etch rate is deposited over or between buried gates of the end portion of a cell region when forming a metal contact at the end portion of the cell region, so that a lower substrate is prevented from being etched during an etching process for metal contact formation. The above technical principles can be applied to all kinds of semiconductor devices including semiconductor elements.

A semiconductor device and a method for fabricating the same according to embodiments of the present invention will hereinafter be described with reference to FIGS. 1 to 2F.

Figure 1:
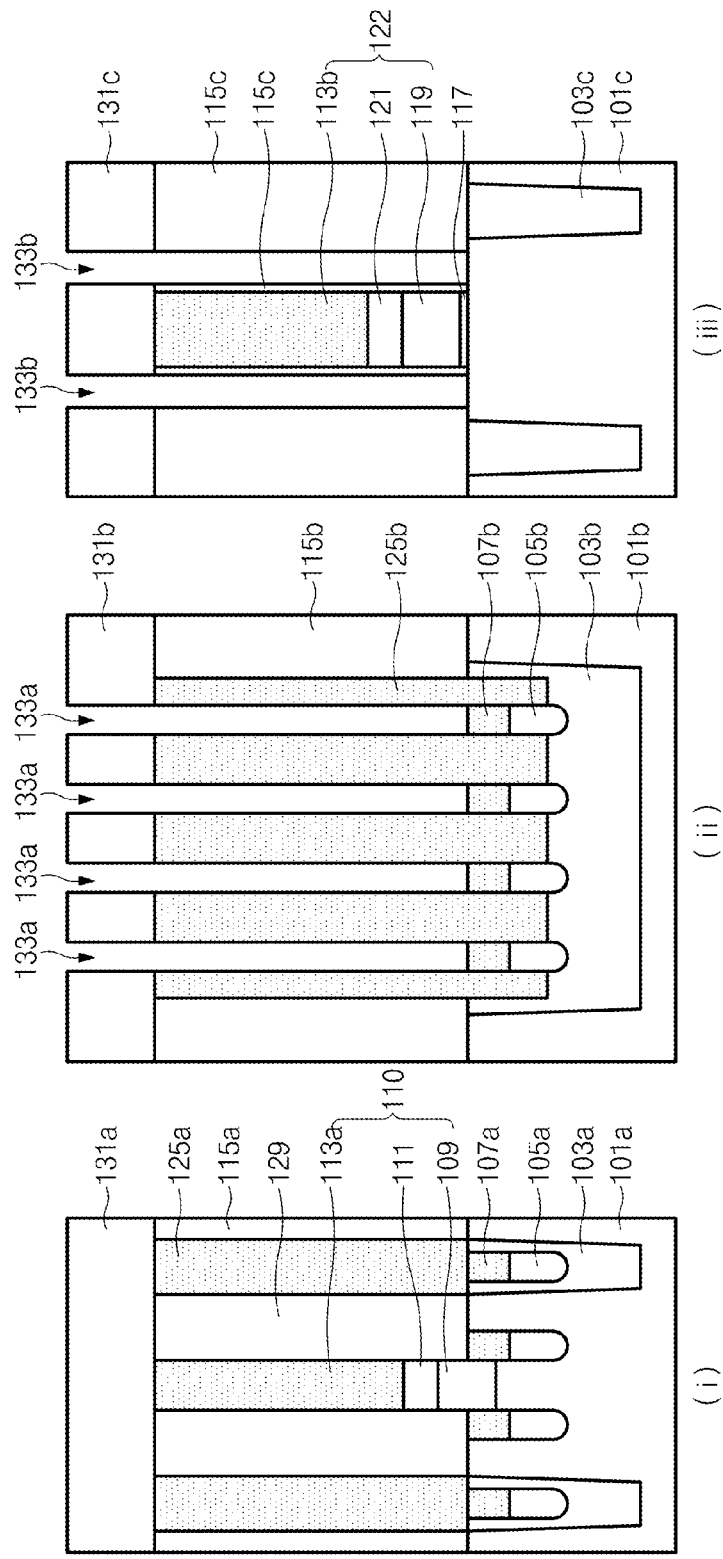
FIG. 1 is a cross-sectional view illustrating a semiconductor device according to an embodiment of the present invention.

FIG. 1 is a cross-sectional view illustrating a semiconductor device according to an embodiment of the present invention.

Referring to FIG. 1, the semiconductor device according to an embodiment of the present invention includes a cell-region center portion (i), a cell-region end portion (ii), and a peripheral region (iii).

The cell-region center portion (i) includes a bit line structure 110 formed over a semiconductor substrate 101a including a device isolation film 103a and a buried gate 105a. In the cell-region center portion (i), an etch stop film 125a is formed over the device isolation film 103a. A storage node contact 129 is formed between the etch stop film 125a and the bit line structure 110. The bit line structure 110 includes a poly layer 109, a tungsten layer 111, and a hard mask nitride film 113a. The cell-region center portion (i) further includes a gate hard mask 107a and interlayer insulation films 115a, 131a, as described further herein.

The cell-region end portion (ii) includes a device isolation film 103b and a buried gate 105b in a semiconductor substrate 101b. In the cell-region end portion (ii), an etch stop film 125b is formed at an upper portion and sidewalls of the buried gate 105b, and a metal contact hole 133a is formed perpendicular to an upper portion of the buried gate 105b. The cell-region end portion (ii) further includes a gate hard mask 107b and interlayer insulation films 115b, 131b, as described further herein. The gate hard mask 107a, 107b include a nitride film. Hereinafter, the buried gate 105b and the gate hard mask 107b are collectively referred to as a cell gate structure.

The peripheral region (iii) includes a peri-gate structure 122 formed over a semiconductor substrate 101c including a device isolation film 103c, and a metal contact hole 133b is formed at both sides of the peri-gate structure 122. The peri-gate structure 122 includes a gate oxide film 117, a polysilicon layer 119, a tungsten layer 121, and a hard mask nitride film 113b. The peripheral region (iii) further includes interlayer insulation films 115c, 131c, as described further herein.

As described above, the etch stop film 125b is deposited over the buried gates 105b of the cell-region end portion (ii) including the metal contact hole 133a, and also between the buried gates 105b, to prevent the metal contact hole 133a from extending to the device isolation film 103b and the semiconductor substrate 101b.

The etch stop film 125b extends down to a level which is lower than a upper surface of the substrate 101b, preferably lower than a top surface of the buried gate 105b.

FIGS. 2A to 2F are cross-sectional views illustrating a method for forming a semiconductor device according to an embodiment of the present invention. The method for forming the semiconductor device according to the embodiment of the present invention will hereinafter be described with reference to FIGS. 2A to 2F.

Figure 2A:
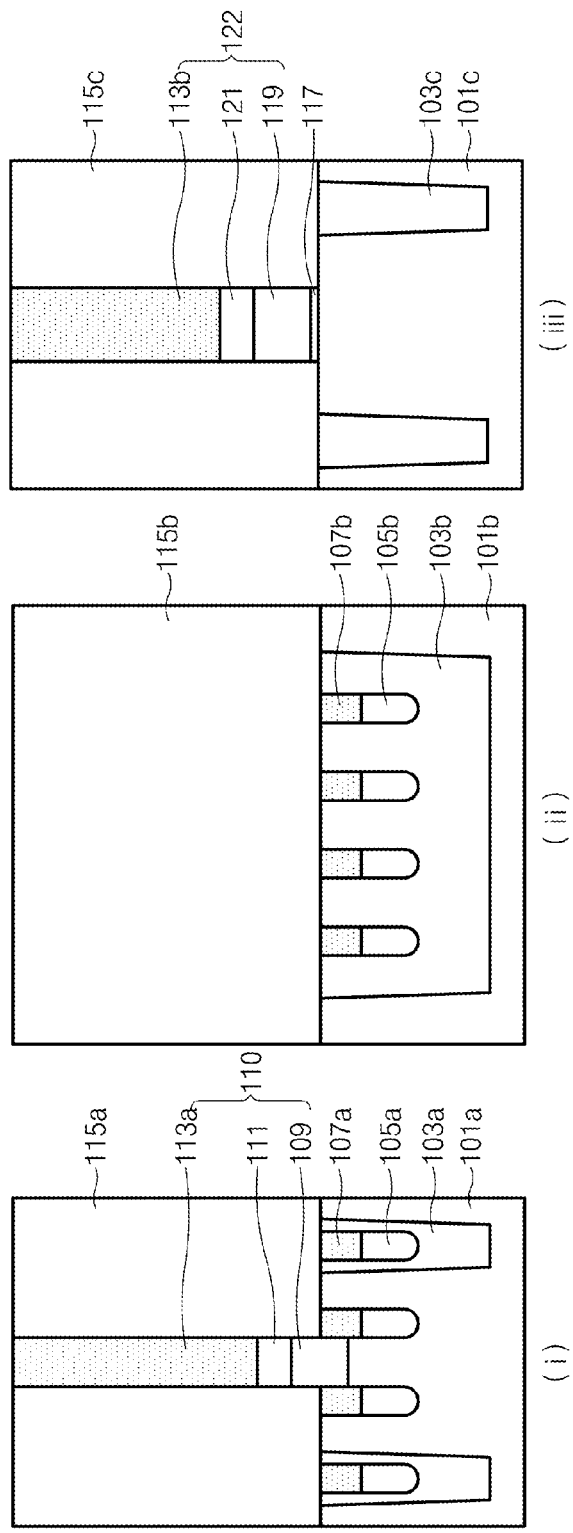
FIGS. 2A to 2G are cross-sectional views illustrating a method for forming a semiconductor device according to an embodiment of the present invention.

Referring to the cell-region center portion (i) shown in FIG. 2A, a semiconductor substrate 101a including a device isolation film 103a is formed using a hard mask pattern (not shown) as a mask so that a first trench (not shown) is formed. In the cell-region end portion (ii), a second trench (not shown) is formed in the device isolation film 103b which is formed in the semiconductor substrate 101b.

Thereafter, a gate insulation film (not shown) and a conductive material are deposited in the first and the second trenches in the cell-region center portion (i) and in the cell-region end portion (ii), so that a buried gate 105a and a buried gate 105b are formed in the cell-region center portion (i) and the cell-region end portion (ii), respectively. In an embodiment, the conductive material may include titanium (Ti) and tungsten (W), and may have a sufficient thickness in a manner that the trench can be sufficiently filled with the conductive material.

Thereafter, gate hard masks 107a and 107b are formed over the buried gates 105a and 105b, respectively, and interlayer insulation films 115a, 115b are formed over the entire surface of an upper portion of the semiconductor substrate including the gate hard masks 107a, 107b in the cell-region center portion (i) and in the cell-region end portion (ii), respectively. A bit line structure 110 is formed at one side of an upper portion of an active region of the cell-region center portion (i). The bit line structure 110 may be formed by sequential deposition of a poly layer 109, a tungsten (W) layer 111, and a hard mask nitride film 113a. An interlayer insulation film 115a is formed over the entire surface of the bit line structure 110, and over the semiconductor substrate 101a.

In the peripheral region (iii), a gate oxide film 117 and a peri-gate structure 122 are formed over a semiconductor substrate 101c including a device isolation film 103c, and an interlayer insulation film 115c is formed over the entire surface of a lateral side of the peri-gate structure 122. Here, the peri-gate structure 122 is formed by sequential deposition of a gate oxide film 117, a polysilicon layer 119, a tungsten (W) layer 121 and a hard mask nitride film 113b.

In an embodiment, the interlayer insulation film (115a, 115b, 115c) may be formed of an oxide-based material.

Figure 2B:
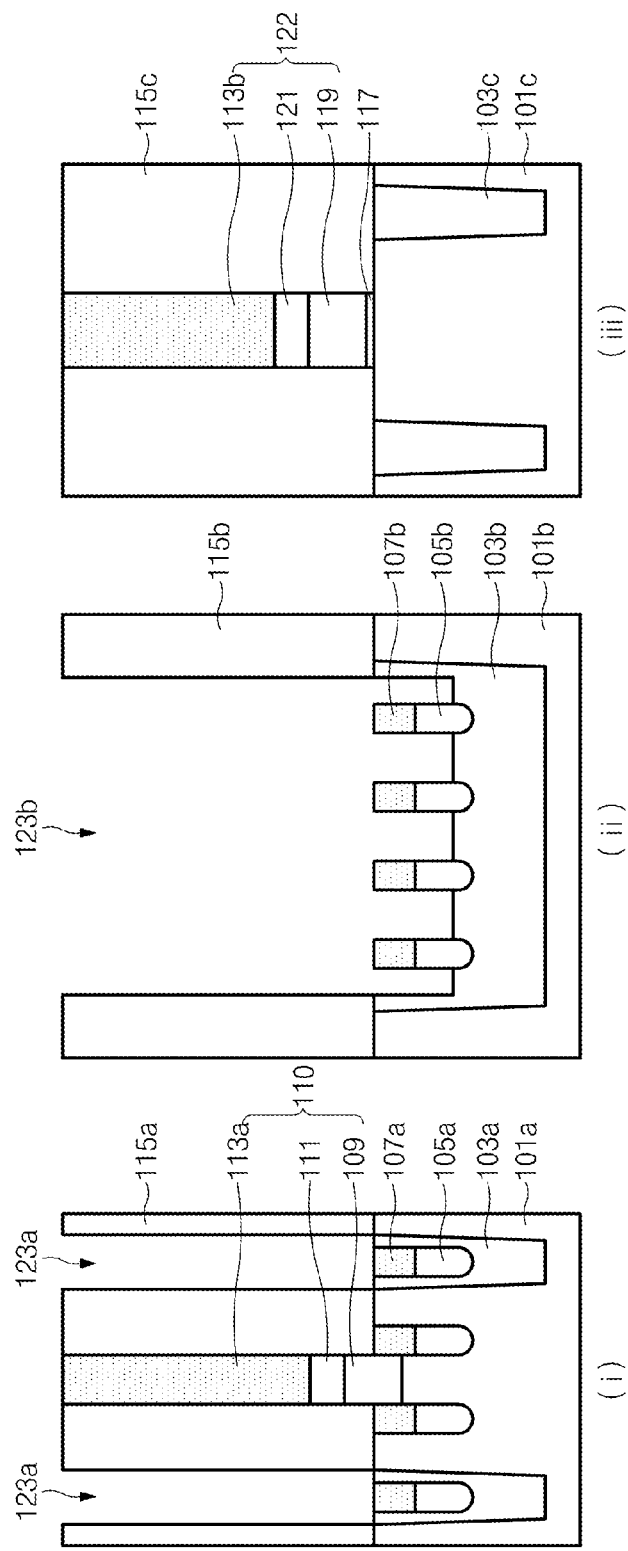

Thereafter, as shown in FIG. 2B, a mask (not shown) for open region formation is formed, and open regions (123a, 123b) are formed over the device isolation films (103a, 103b) of the cell-region center and end portions (i, ii) using the formed mask (not shown). In the cell-region center portion (i), the open region 123a exposes the buried gate 105a formed in the device isolation film 103a. In the cell-region end portion (ii), the open region 123b is etched, preferably until a sidewall of the buried gate 105b is exposed.

Figure 2C:
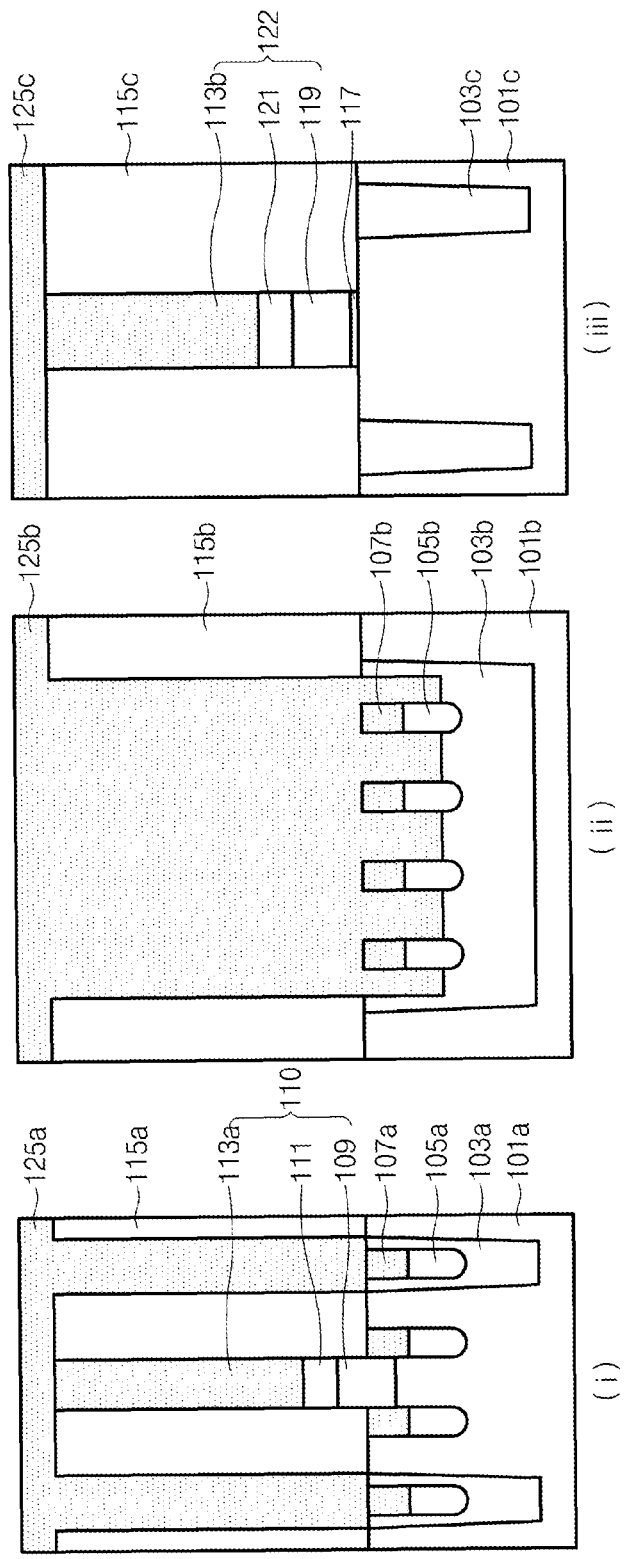

Referring to FIG. 2C, etch stop layers (125a, 125b, 125c) are deposited over the entire surface of the open regions (123a, 123b) of the cell-region center portion (i) and the cell-region end portion (ii) shown in FIG. 2B, and also over the interlayer insulation film 115c and the hard mask nitride film 113b of the peripheral region (iii). The etch stop layer 125b extends between gate hard mask 107b formed in the cell-region end portion (ii). The etch stop layer 125b may further extend between the buried gates 105b in the cell-region end portion (ii).

In an embodiment, the etch stop film (125a, 125b or 125c) may be formed of a material having a lower etch rate than the interlayer insulation film (115a, 115b or 115c). For example, if the interlayer insulation film (115a, 115b or 115c) is formed of an oxide material, the etch stop film (25a, 125b or 125c) may be formed of a nitride film having a lower etch rate than an oxide material.

More specifically, the etch stop film 125b has an etch rate lower than the device isolation film 103b in the cell region end portion (ii).

Figure 2D:
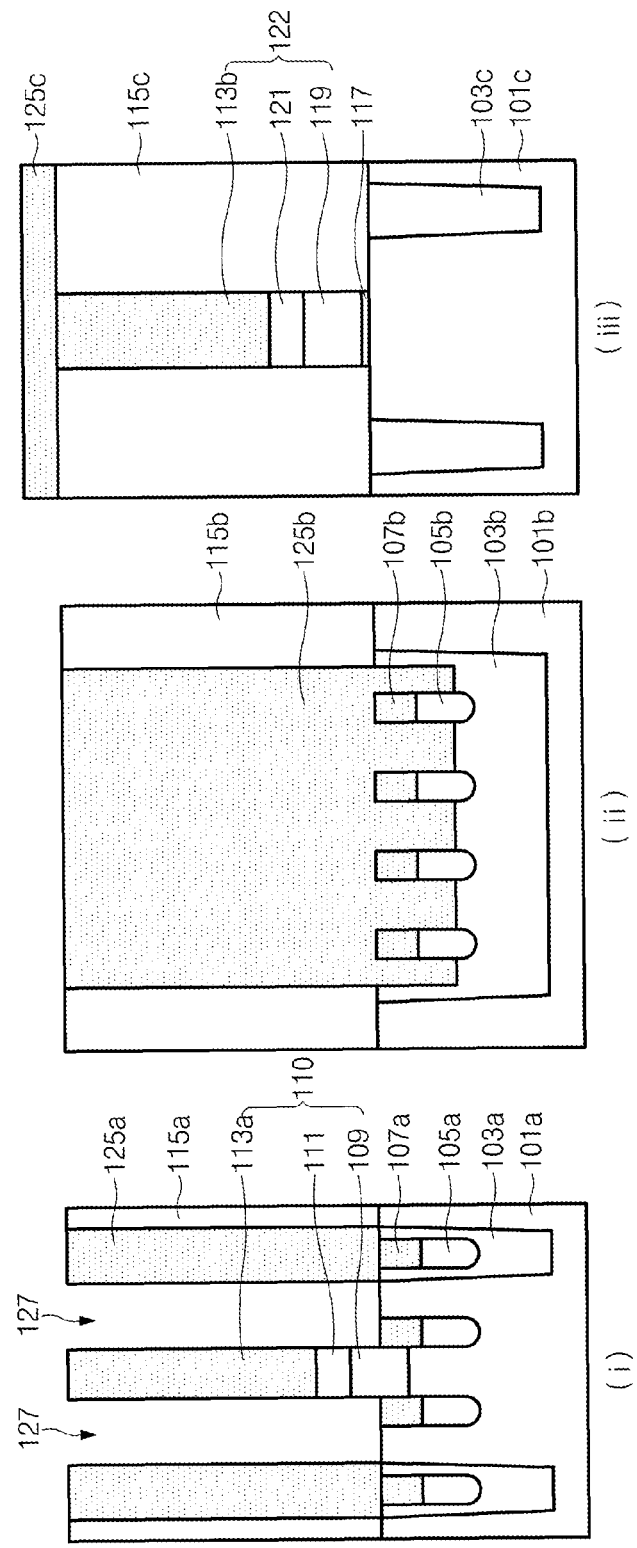

Referring to FIG. 2D, a cell-open mask (not shown) for forming a storage node contact is formed in the cell-region center portion (i). The interlayer insulation film (115a) and the etch stop film (125a) over the interlayer insulation films (115a) are etched using the cell-open mask (not shown). As a result, a storage node contact hole 127 is formed at both sides of the bit line structure 110 in an active region of the cell-region center portion (i). The etch stop film 125b in the cell-region end portion (ii) is subject to planarization. In an embodiment, the etch stop films (125a, 125b) and the interlayer insulation film (115a) may be wet-etched.

Figure 2E:
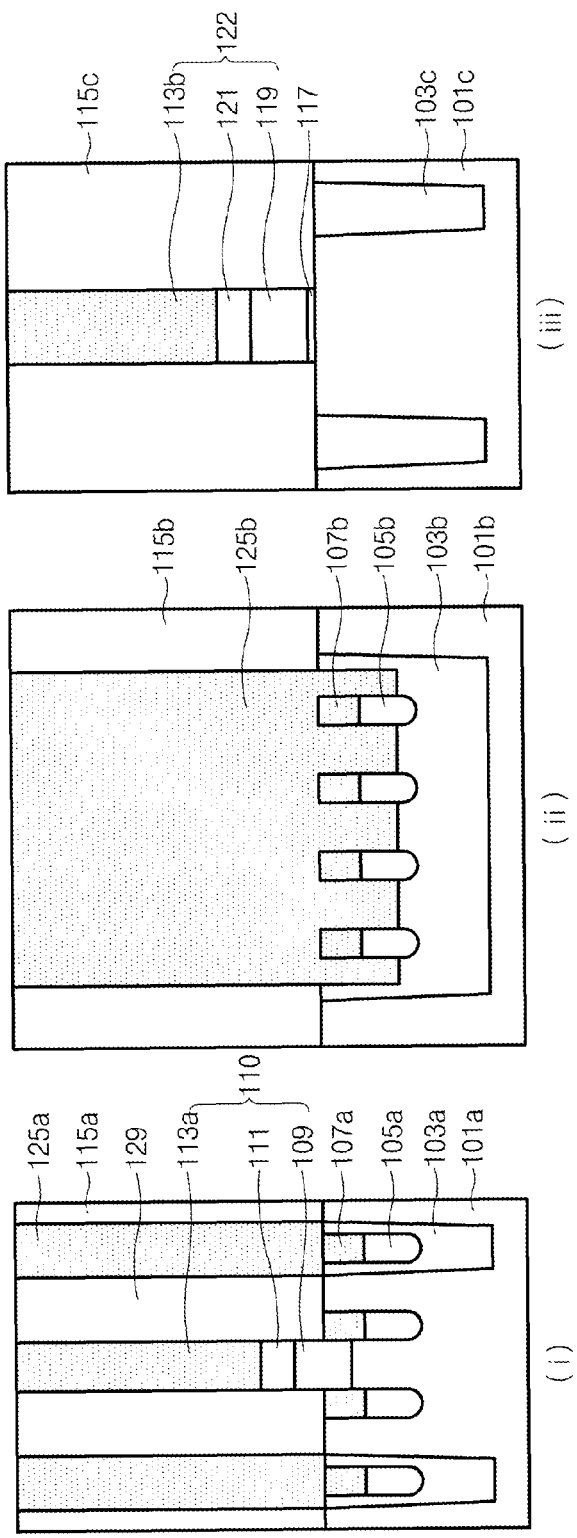

Referring to FIG. 2E, a conductive material fills the storage node contact hole 127 in the cell-region center portion (i), and the resultant conductive material is then planarized, so that the etch stop film 125a is exposed. Thereby, a storage node contact 129 is formed. In an embodiment, the conductive material may be formed of a poly material, and the planarization may be carried out through Chemical Mechanical Polishing (CMP) or etching. The etch stop film 125b formed over the peripheral region (iii) is planarized to a predetermined thickness so that an upper portion of the interlayer insulation film 115c is exposed.

Figure 2F:
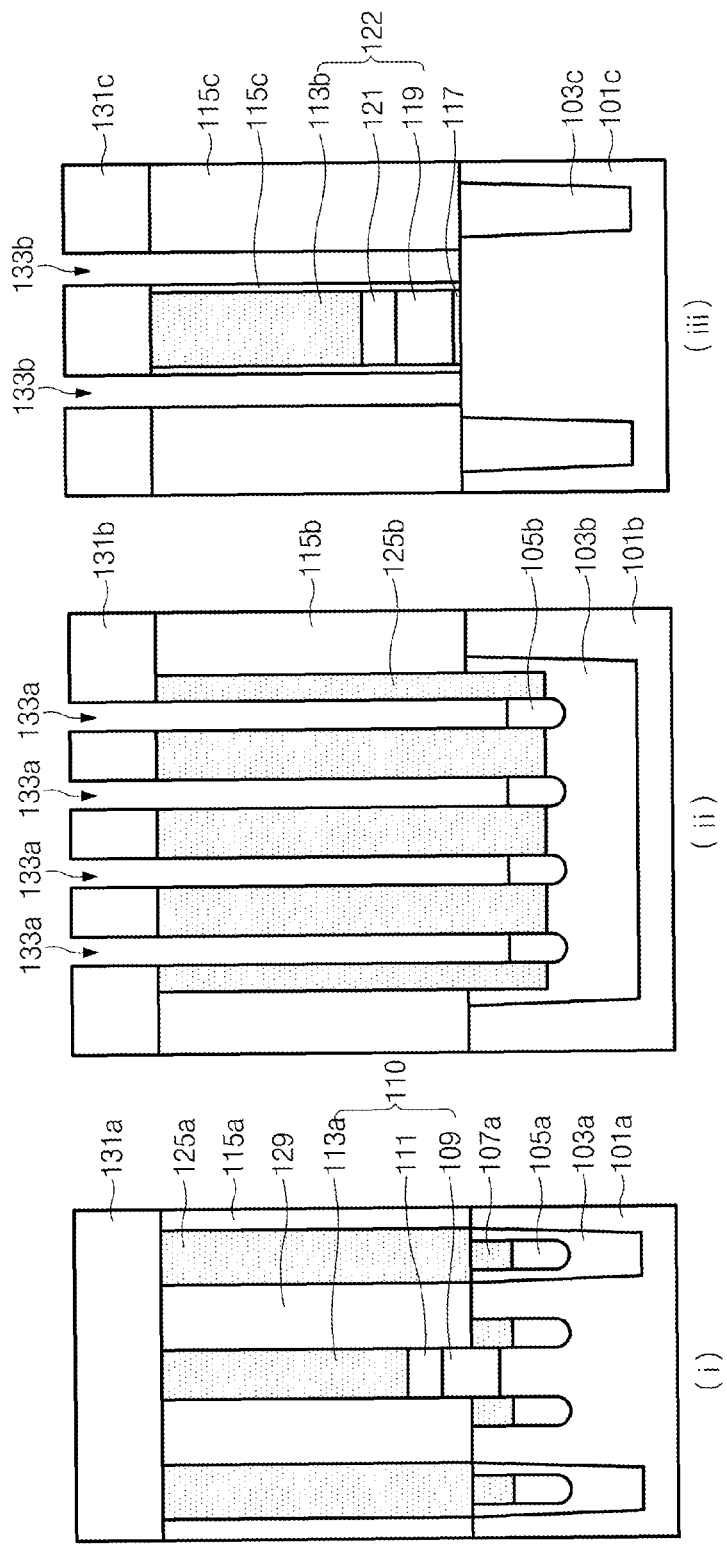

Referring to FIG. 2F, interlayer insulation films (131a, 131b, 131c) are deposited over the entire upper surfaces of the cell-region center portion (i), the cell-region end portion (ii), and the peripheral region (iii). The metal contact holes (133a, 133b) are then formed in the cell-region end portion (ii) and the peripheral region (iii), respectively.

The metal contact hole 133a of the cell-region end portion (ii) is vertically formed over the buried gate 105b by etching the etch stop film 125b. The etch stop film 125b having a predetermined thickness remains both of sides the buried gate 105b. In addition, a metal contact hole 133b is formed in the peripheral region (iii) such that the active region of the semiconductor substrate 101c of both sides of the peri-gate structure 122 is exposed.

In an embodiment, the metal contact hole 133a exposes the buried gate 105b. The metal contact hole 133b exposes the substrate 101c in the peripheral region (iii).

Figure 2G:
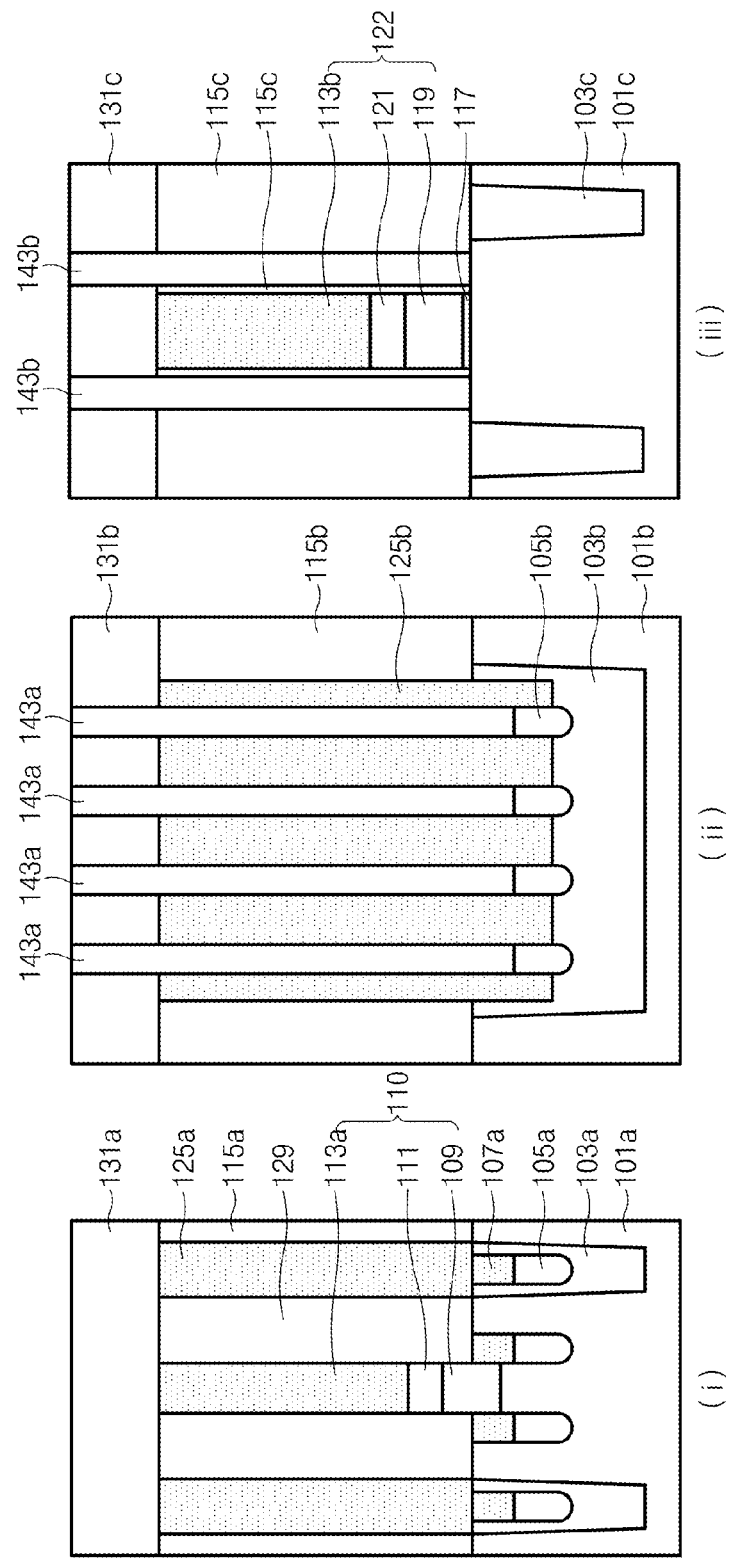

Thereafter, Referring to FIG. 2G, metal material fills the metal contact holes (133a, 133b) to form first and second metal contacts (or a first and second power supply contacts) 143a, 143b. Power (or voltage) is supplied from outside to the cell gate structure 105b, 107b and the peri-gate structure 122 through the first metal contact (the first power supply contact) 143a and the second metal contact (the second power supply contact) 143b, respectively.

The metal contact hole 133a in the cell-region end portion (ii) extends down to the top surface of the buried gate 105b or deeper. The metal contact hole 133b in the peripheral region (iii) extends to a level which is substantially equal to or lower than a surface of the substrate 101c.

Put another way, the metal contact hole 133a in the cell-region end portion (ii) extends to the first level lower than the fourth level to which the metal contact hole 133b in the peripheral region (iii) extends.

As described above, according to the embodiments of the present invention, the etch stop film 125b is deposited over and between the buried gates 105b of the cell-region end portion (ii). As a result, although misalignment occurs in the process for forming the metal contact hole 133a, the etch stop film 125b can prevent the semiconductor substrate from being etched.

In more detail, first, the etch stop film 125b in the cell-region end portion (ii) extends down to the top surface of the buried gate 105b or deeper. Second, the etch stop film 125b has an etch selectivity lower than that of the device isolation film 103b (c). Thus, under a given etching condition, the substrate 101b in the cell-region end portion (ii) can be protected from being attacked during the process of forming the metal contact hole 133a in the cell-region end portion (ii).

As is apparent from the above description, a nitride material having a lower etch rate than an oxide material is deposited over and between the buried gates, so that it can prevent the etching range for metal contact hole formation from extending to each buried gate or an oxide material located at a lateral surface of the buried gate, and therefore the semiconductor substrate is prevented from being exposed.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   at least one buried gate formed in a device isolation film of a semiconductor substrate;
   an etch stop film formed over and between the buried gates; and
   a metal contact formed in the etch stop film, perpendicular to the buried gate.

2. The semiconductor device according to claim 1, wherein the etch stop film is formed of a material having a lower etch rate than the device isolation film.

3. The semiconductor device according to claim 1, wherein the etch stop film is formed of a nitride film.

4. The semiconductor device according to claim 1, wherein the buried gate, the etch stop film, and the metal contact are formed in an end portion of a cell region.

5. A semiconductor device comprising:
   first power supply contacts provided in a cell end region;
   cell gates formed below the first power supply contacts and formed in a first device isolation film of the cell end region, respectively; and
   an etch stop film extending from between the first power supply contacts to between the cell gates.

6. The semiconductor device of claim 5, the device further comprising:
   a second power supply contact coupled to an active region in a peripheral region,
   wherein the etch stop film extends down to a first level, and
   wherein the second power supply contact extends down to a second level higher than the first level.

7. The semiconductor device of claim 6,
   wherein the first power supply contacts are coupled to the cell gates, respectively, and
   wherein the second power supply contact is coupled to the active region.

8. The semiconductor device of claim 5,
   wherein the etch stop film extends down to a first level, and
   wherein the cell gates extends down to a third level lower than the first level.

9. The semiconductor device of claim 8,
   wherein the first device isolation film extends down to a fourth level lower than the third level.

10. The semiconductor device of claim 5,
    wherein the etch stop film extends down to a first level, and
    wherein first power supply contacts extend down to a fifth level higher than the first level.

11. The semiconductor device of claim 10,
    wherein the fifth level is substantially the same as a top surface of any of the cell gates.

12. The semiconductor device of claim 5,
    wherein the etch stop film extends down to a first level, and
    wherein an upper surface of a substrate in the cell end region extends up to a sixth level higher than the first level.

13. The semiconductor device of claim 5,
    wherein the etch stop film has a first etch selectivity with respect to a given etching condition,
    wherein the first device isolation film has a second etch selectivity with to the given etching condition, and
    wherein the first etch selectivity is lower than the second etch selectivity.

14. The semiconductor device of claim 13,
    wherein etch stop film includes an nitride-containing layer, and
    wherein the first device isolation film includes a oxide-containing layer.

15. The semiconductor device of claim 5, the device further comprising:
    an insulating layer provided in the peripheral region, defining the second power supply contact, and having a third etch selectivity,
    wherein the etch stop film has a first etch selectivity with respect to a given etching condition, and
    wherein the first etch selectivity is lower than the third etch selectivity with respect to the given etching condition.

16. The semiconductor device of claim 15,
    wherein the first device isolation film has a second etch selectivity with to the given etching condition, and
    wherein the third etch selectivity is substantially the same as the second etch selectivity.

17. The semiconductor device of claim 5, the device further comprising:
    a cell center region laterally extending from the cell end region,
    a storage node contact provided in the cell center region and extending down to an eighth level higher than the first level.

18. The semiconductor device of claim 17,
    wherein the cell gates extend to the cell center region, and
    wherein the storage node contact is coupled to any of the cell gates.

* * * * *